US010802365B2

(12) United States Patent
Wang (10) Patent No.: US 10,802,365 B2
(45) Date of Patent: Oct. 13, 2020

(54) ARRAY SUBSTRATE AND DISPLAY PANEL (71) Applicants: BOE TECHNOLOGY GROUP CO., LTD., Beijing (CN); BEIJING BOE DISPLAY TECHNOLOGY CO., LTD., Beijing (CN)

(72) Inventor: Zheng Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

(*) Notice: Subject to any disclaimer, the term of this patent is extended or adjusted under 35 U.S.C. 154(b) by 64 days.

(21) Appl. No.: 15/761,414

(22) PCT Filed: Jul. 31, 2017

(86) PCT No.: PCT/CN2017/095198
§ 371 (c)(1),
(2) Date: Mar. 19, 2018

(87) PCT Pub. No.: WO2018/032960
PCT Pub. Date: Feb. 22, 2018

(65) Prior Publication Data
US 2020/0233274 A1 Jul. 23, 2020

(30) Foreign Application Priority Data
Aug. 17, 2016 (CN) .......................... 2016 1 0681210

(51) Int. Cl.
G02F 1/1362 (2006.01)
G09G 3/36 (2006.01)
G11C 19/28 (2006.01)
(52) U.S. Cl.
CPC ..... *G02F 1/136286* (2013.01); *G09G 3/3688* (2013.01); *G11C 19/28* (2013.01); *G09G 2310/0286* (2013.01)

(58) Field of Classification Search
None
See application file for complete search history.

(56) References Cited

U.S. PATENT DOCUMENTS

2012/0026420 A1 2/2012 Saitoh
2016/0328037 A1 11/2016 Zhuang et al.

FOREIGN PATENT DOCUMENTS

CN 102540525 A 7/2012
CN 102983132 A 3/2013
(Continued)

OTHER PUBLICATIONS

Office Action received for Chinese Patent Application No. 201610681210.0, dated Mar. 9, 2018, 7 pages (2 pages of English Translation and 5 pages of Office Action).
(Continued)

*Primary Examiner* — Aneeta Yodichkas
(74) *Attorney, Agent, or Firm* — Womble Bond Dickinson (US) LLP (57) ABSTRACT An array substrate and a display panel are disclosed. The array substrate comprises shift registers corresponding to respective gate lines. The transistor in each stage of shift register connected with a corresponding stage of gate line and a next stage of gate line is a first transistor. The signal line connected with the first transistor in a plurality of signal lines connected with the shift register is a first signal line. The first transistor and the signal line connected with the first transistor are arranged in the display area, which can reduce the width of the frame area without completing the wiring layout design of the array substrate.

20 Claims, 5 Drawing Sheets (56) References Cited

FOREIGN PATENT DOCUMENTS

| CN | 104820520 A | 8/2015 |
|---|---|---|
| CN | 106098010 A | 11/2016 |

OTHER PUBLICATIONS

International Search Report received for PCT Patent Application No. PCT/CN2017/095198, dated Nov. 8, 2017, 6 pages (2 pages of English Translation and 4 pages of Original Document).

ARRAY SUBSTRATE AND DISPLAY PANEL

CROSS REFERENCE OF RELATED APPLICATION

The present application is the U.S. national phase entry of PCT/CN2017/095198, with an international filing date of Jul. 31, 2017, which claims priority benefit to the patent application No. CN201610681210.0 filed on Aug. 17, 2016 to Chinese Patent Office, the disclosure of which is incorporated herein by reference.

TECHNICAL FIELD

This disclosure relates to the field of display technology, particularly to an array substrate and a display panel.

BACKGROUND

In today's era of rapid change and development of technology, the liquid crystal display has been widely applied in electronic display products, such as television, computer, mobile phone and personal digital assistant device, etc. The liquid crystal display includes a source driver, a gate driver and a liquid crystal display panel and so on. The liquid crystal display panel has a pixel array, while the gate driver is used for activating corresponding pixel rows in the pixel array in sequence, so as to transmit the pixel data outputted by the source driver to the pixels for displaying images.

At present, the gate driver is generally formed on an array substrate of the liquid crystal display through an array process, i.e., the gate driver on array (GOA) process, such an integration process not only saves the cost but also can realize symmetrical appearance design of the liquid crystal panel, meanwhile, wiring spaces for the bonding area and the fan-out area of the gate integrated circuit can be omitted, thereby achieving a narrow frame design. Moreover, such an integration process can also avoid the bonding process applied in the gate scanning line direction, thereby improving the productivity and yield.

SUMMARY

Embodiments of this disclosure provide an array substrate and a display panel for reducing the frame width of the display device.

The array substrate provided by an embodiment of this disclosure comprises: a base substrate that comprises a display area and a frame area surrounding the display area, the display area comprising data lines and gate lines in staggered arrangement; shift registers in one-to-one correspondence with the gate lines, each stage of shift register comprising a plurality of transistors, one of the plurality of transistors in the shift register that is connected with both a gate line corresponding to the shift register and a gate line of a next stage is a first transistor, the first transistor in each shift register is located in the display area, and other transistors of the plurality of transistors are located in the frame area; and a plurality of signal lines connected with the shift registers. A signal line of the plurality of signal lines connected with the is first transistor is a first signal line, and the first signal line is located in the display area, and other signal lines of the plurality of signal lines are located in the frame area.

In some embodiments, the display area comprises a plurality of pixel sub-areas arranged in a matrix, each first transistor includes at least two sub-transistors of a same size and connected in parallel with each other, and a number of the sub-transistors in each first transistor is less than or equal to a number of the pixel sub-areas in a row of pixels corresponding to the shift register where the first transistor locates, and the sub-transistors are evenly distributed in the display area.

In some embodiments, each of the first transistors has a same number of sub-transistors.

In some embodiments, the first signal line comprises a plurality of wires, the sub-transistors included in each first transistor are connected with the plurality of wires in one-to-one correspondence.

In some embodiments, the first transistor is configured to enable a signal on a gate line corresponding to the shift register where the first transistor locates to be same as a signal on the first signal line in response to receipt of an effective signal on a gate line corresponding to a shift register of a next stage.

In some embodiments, the plurality of signal lines comprise a clock signal line for transmitting a clock signal, a first reference potential signal line for providing a high reference potential and a second reference potential signal line for providing a low reference potential.

In some embodiments, the first signal line is the second reference potential signal line for providing the low reference potential.

In some embodiments, two gate lines are arranged between every two adjacent rows of pixel sub-areas, and every two adjacent columns of pixel sub-areas share one data line located between the two adjacent columns of pixel sub-areas, the two adjacent columns of pixel sub-areas defines a pixel group.

In some embodiments, sub-transistors of the first transistor in a (2n−1)-th is stage of shift register are arranged in an n-th row of pixel sub-area, n is an integer from 1 to N/2, N is the number of the gate lines in the array substrate, and sub-transistors of the first transistor in a 2n-th stage of shift register are arranged between a (2n−1)-th gate line and a 2n-th gate line.

In some embodiments, each of the wires is located between two adjacent pixel groups respectively.

In some embodiments, the sub-transistors of the first transistor in the (2n−1)-th stage of shift register are connected with the (2n−1)-th gate line through a first wiring; the sub-transistors of the first transistor in the 2n-th stage of shift register are connected with the 2n-th gate line through a second wiring and a third wiring.

In some embodiments, the first wiring and the second wiring are metal wirings formed from a same material, the third wiring is a metal oxide wiring.

In some embodiments, only one gate line is arranged between two adjacent rows of pixel sub-areas, and only one data line is arranged between two adjacent columns of pixel sub-areas; the sub-transistors of the first transistor in an n-th stage of shift register are arranged in an n-th row of pixel sub-area, n is an integer from 1 to N, N is the number of the gate lines in the array substrate.

In some embodiments, the plurality of sub-transistors comprised in each stage of shift register have a same distribution pattern in a row direction.

In some embodiments, the wire in corresponding connection with each sub-transistor is located outside the pixel sub-area where the sub-transistor locates.

Accordingly, an embodiment of the disclosure further provides a display panel comprising the array substrate according to any one of the above embodiments.

DETAILED DESCRIPTION OF EMBODIMENTS

In order to make the objective, technical solutions and advantages of this disclosure more clear, next, specific implementations of the array substrate and the display panel provided by embodiments of this disclosure will be explained in detail in conjunction with the drawings.

The shapes and the sizes of the components in the drawings do not reflect the real proportions for the corresponding elements in the array substrate, which merely aim to illustrating the disclosure.

Figure 1A:
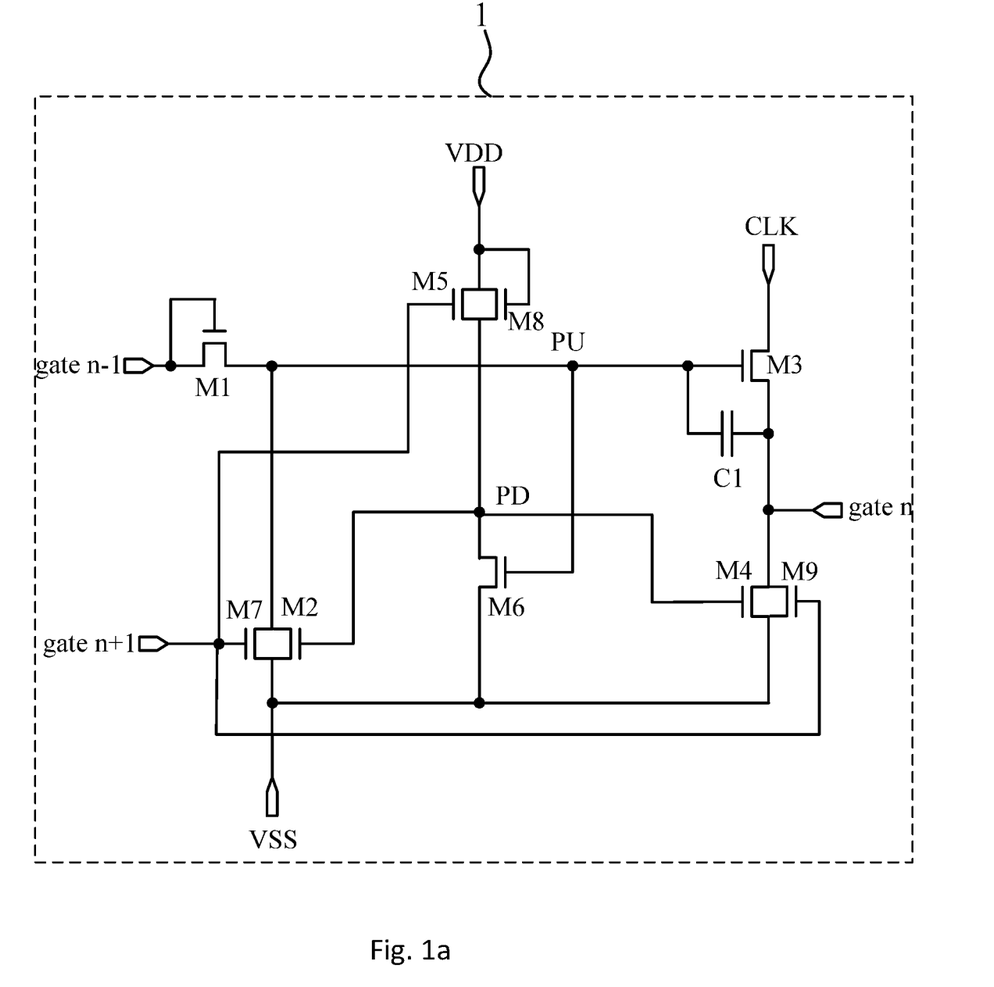
FIG. 1a is a schematic circuit diagram of a shift register according to an embodiment of this disclosure.

The gate driver generally comprises a plurality of cascaded shift registers, so as to perform scanning to the gate lines in the display panel row by row. Each shift register typically comprises a plurality of transistors, for example, the shift register 1 as shown in FIG. 1a comprises nine transistors (M1-M9) and one capacitor C1.

Figure 1B:
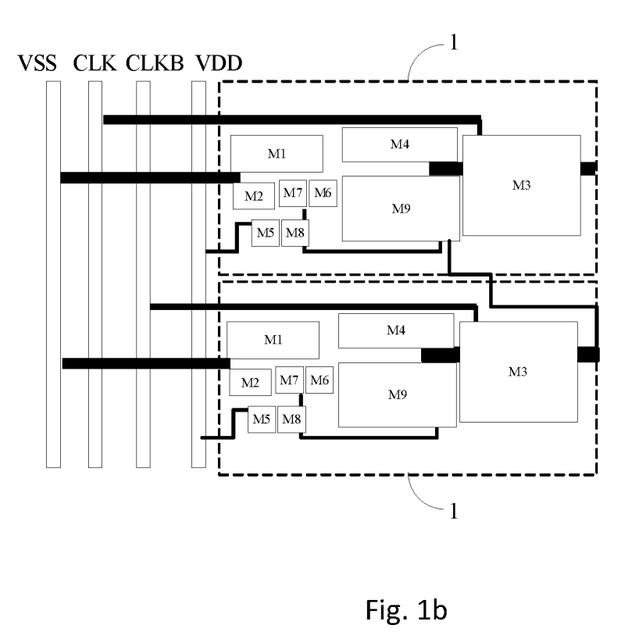
FIG. 1b is a schematic view of distribution of the shift register as shown in FIG. 1a in the frame area of the display panel according to the related array substrate design technology.

According to related array substrate design technology, the layout of the shift register 1 in the frame area of the display panel is as shown in FIG. 1b. Since the shift register comprises a large number of transistors, some of the transistors have a relatively larger size, and signal lines for providing various signals to the shift register are also arranged in the frame area (such as a second reference potential signal line VSS for providing a ground reference potential, clock signal lines CLK, CLKB for transmitting clock signals and a first reference potential signal line VDD for providing a high reference potential, as shown in FIG. 1b), the arrangement of elements and signal lines as shown in FIG. 1b could not realize an effect of narrow frame.

Figure 2:
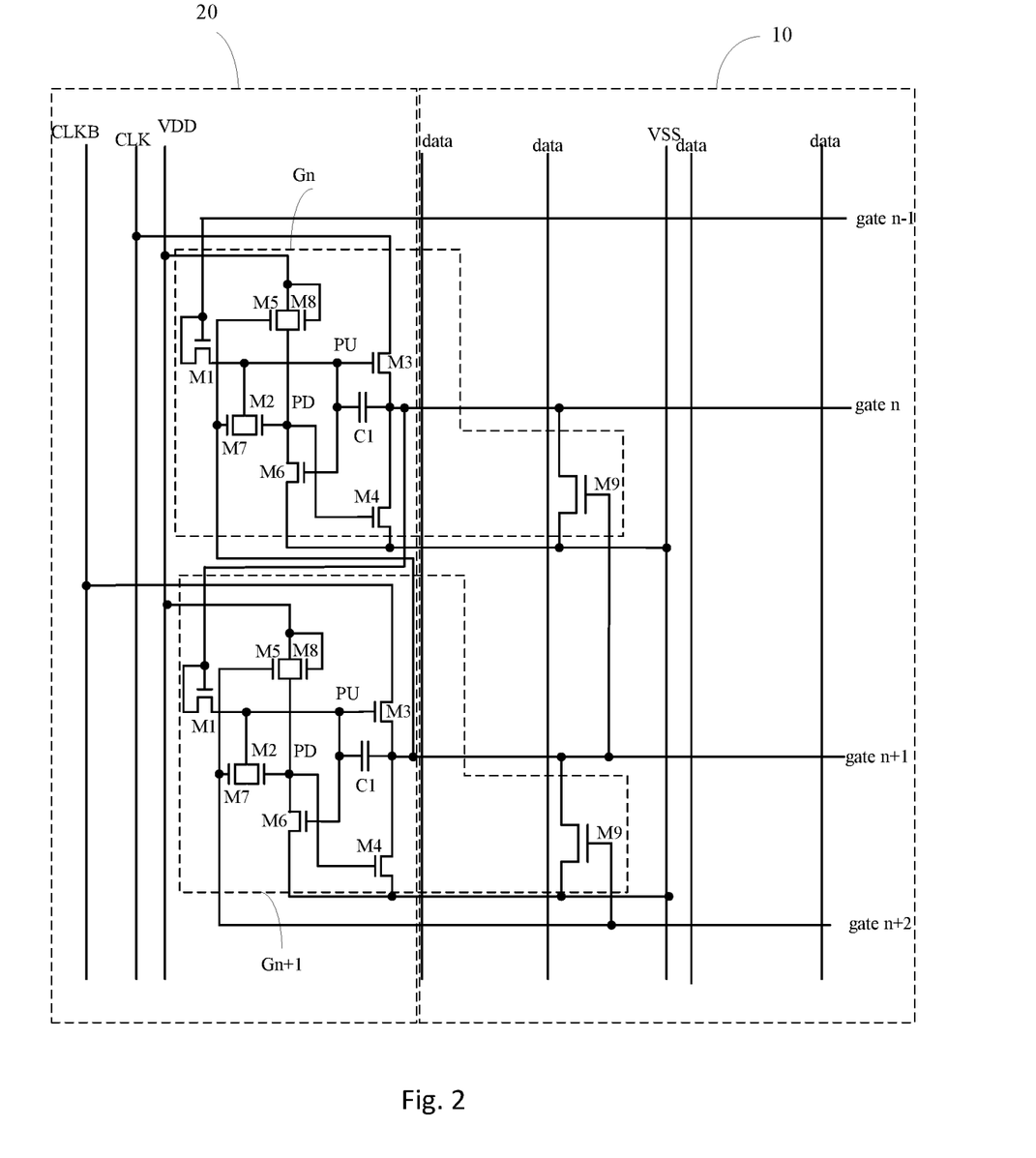
FIG. 2 is a schematic view of an array substrate provided by an embodiment of this disclosure.

An array substrate according to an embodiment of this disclosure, as shown in FIG. 2, comprises a base substrate that has a display area 10 and a frame area 20 surrounding the display area 10. Data lines data and gate lines gate n(n=1, 2, 3, 4 . . . ) intersect with each other in the display area 10 of the base substrate. The array substrate further comprises shift registers Gn in one-to-one correspondence with the gate lines gate n, and a plurality of signal lines (e.g., CLK, CLKB, VDD and VSS in FIG. 2) connected with respective stages of shift registers Gn. The shift register Gn comprises a plurality of transistors (e.g., transistors M1-M9 in FIG. 2).

The transistor in each stage of shift register Gn connected with both the gate line gate n corresponding to the shift register and a next stage of gate line gate n+1 is referred to as a first transistor (e.g., M9 in FIG. 2). The signal line in the plurality of signal lines connected with the first transistor M9 is referred to as a first signal line (e.g., VSS in FIG. 2). For each stage of shift register Gn, except for the first transistor M9 that is located in the display area 10, other transistors (e.g., M1-M8) are all located in the frame area 20. For the plurality of signal lines, except for the first signal line that is located in the display area 10, other signal lines are all located in the frame area 20.

With the above array substrate provided by the embodiment of this disclosure, shift registers corresponding to the gate lines are arranged on the array substrate. The transistor in each stage of shift register connected with a corresponding stage of gate line and a next stage of gate line is called as a first transistor. The signal line connected with the first transistor among a plurality of signal lines connected with the shift register is called as a first signal line. By arranging the first transistor and the signal line connected with the first transistor in the display area, the width of the frame area can be reduced without complicating the wiring layout for the array substrate.

It should be noted that, the disclosure explains the layout of the elements in the shift register in the array substrate provided by the embodiment of this disclosure by merely taking the shift register as shown in FIG. 1a as an example, however, the present invention is not so limited. The principle revealed by the array substrate provided by the embodiment of this disclosure can be applied to shift registers of various circuit structures known in the art, as long as each stage of shift register comprises a transistor connected with both a corresponding stage of gate line and a next stage of gate line, the first transistor and the signal line connected with the first transistor are arranged in the display area. It could be understood that the signal lines mentioned in the above array substrate provided by the embodiment of the disclosure do not include the gate lines.

In practice, as for the array substrate provided by the embodiment of this disclosure, the first transistor in each stage of shift register generally has a large size, hence, in order to avoid the display effect being influenced, the first transistor can be replaced with several sub-transistors of small size. In this way, the function of the first transistor of a large size can be equivalently achieved by combining multiple sub-transistors of small size. Moreover, the sub-transistors of small size can be distributed in the display area uniformly. The influence by the sub-transistors on the aperture ratio of the array substrate can be ignored visually, so as to ensure the display effect.

Figure 3:
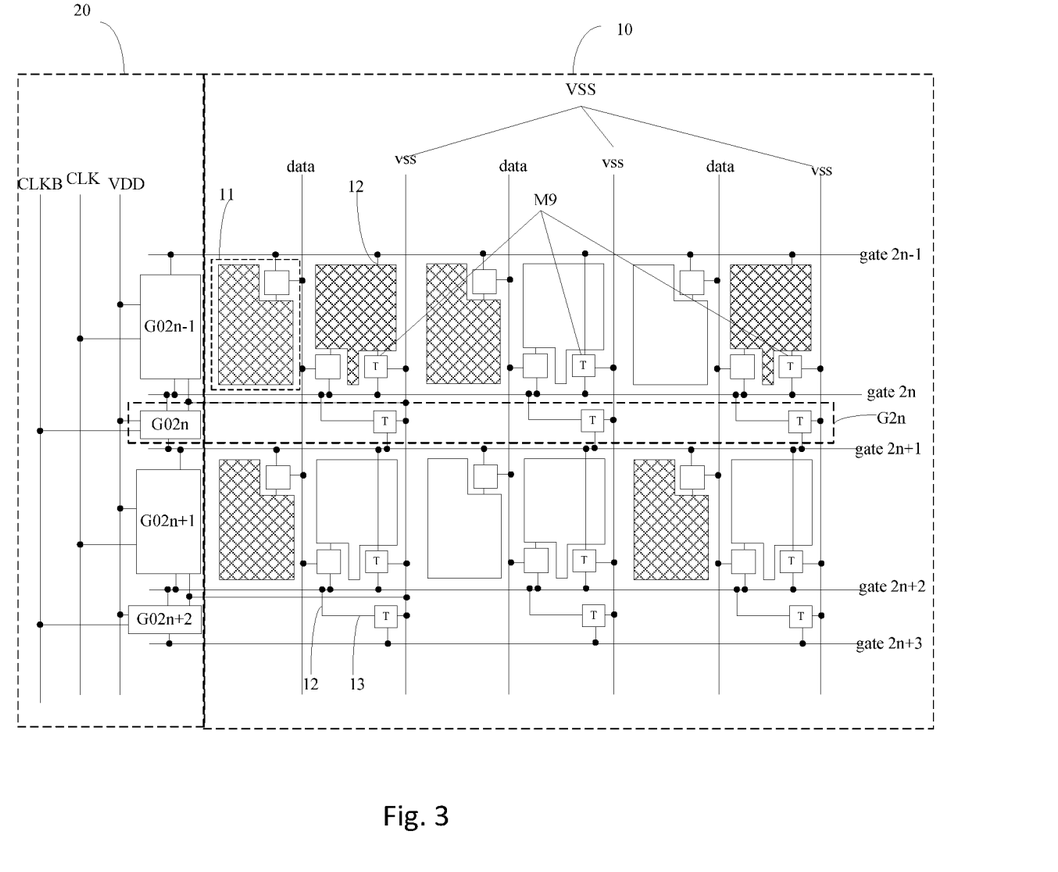
FIG. 3 is a schematic view of an array substrate provided by another embodiment of this disclosure.
Figure 4:
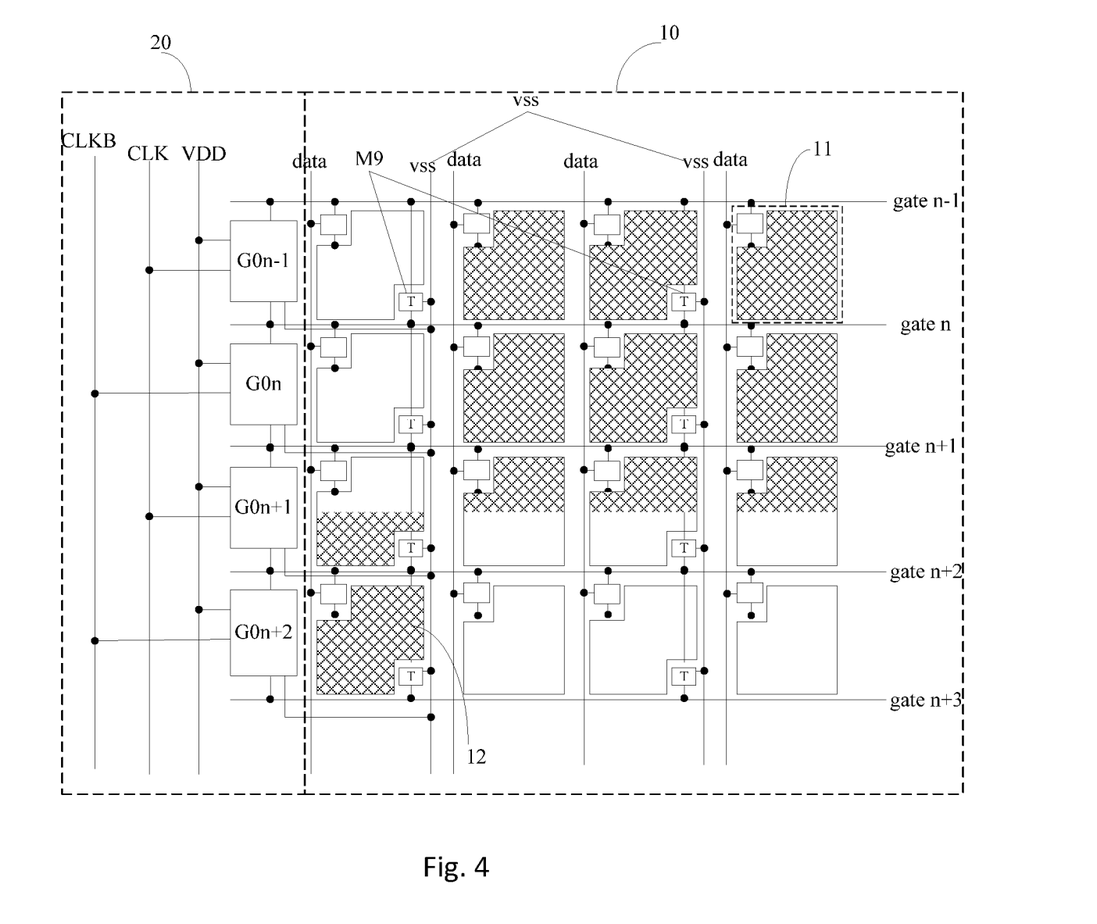
FIG. 4 is a schematic view of an array substrate provided by a further embodiment of this disclosure.

Therefore, in an array substrate provided by an embodiment of this disclosure, as shown in FIG. 3 and FIG. 4 (in FIG. 3 and FIG. 4, elements other than the first transistor in the shift register are represented as G0 n, whose specific structures are not shown in the figures), the display area 10 comprises a plurality of pixel sub-areas 11 arranged in matrix. Each of the first transistors M9 comprises at least two sub-transistors T of the same size connected in parallel with each other, and the number of the sub-transistors T comprised by each first transistor M9 is less than or equal to the number of the pixel sub-areas 11 comprised in a row of pixel sub-areas. The sub-transistors T are evenly distributed in the display area 10.

It should be noted that in the above array substrate provided by the embodiment of this disclosure, the row direction refers to the extending direction of the gate line, and the column direction refers to the extending direction of the data line.

In the array substrate provided by some embodiments of this disclosure, the sub-transistors of the same first transistor is connected with the same two is gate lines and the same signal line. For example, in FIG. 3, the sub-transistors in the first transistor M9 in the n-th row of pixel sub-area 11 are all connected with the (2n−1)-th gate line gate 2n−1, the 2n-th gate line gate 2n and the signal line VSS.

Further, in an array substrate provided by an embodiment of this disclosure, in order to reduce the difficulty in manufacturing, the first transistors have the same number of sub-transistors.

In specific implementation, each sub-transistor has to be connected with the first signal line, hence, in the nay substrate provided by some embodiments of this disclosure, as shown in FIG. 3 and FIG. 4, the first signal line VSS comprises a plurality of wires vss, and the number of the wires vss is equal to the number of the sub-transistors T comprised by a firs transistor M9. Each sub-transistor T of the first transistor M9 is connected with one wire vss, respectively. In addition, it could be understood from the embodiments as shown in FIG. 3 and FIG. 4 that, the first transistor in each stage of shift register is configured to, in response to receipt of an effective signal on a next stage of gate line, enable the level of the signal on the current stage of gate line to be equal to the level of the signal on the first signal line. For example, in case the effective signal on the gate line is a high level, the first transistor can be turned on upon receipt of a high level effective signal on the next stage of gate line, so as to enable the signal on the gate line corresponding to the first transistor to be a low level signal from the second reference potential signal line VSS, i.e., in such a case, the first transistor plays the function of pulling down the signal on the gate line.

Next, the distribution of the sub-transistors in the display area in the embodiment of this disclosure will be explained through specific examples.

The array substrate according to the embodiment as shown in FIG. 3 is a dual-gate structure, i.e., in the above array substrate provided by this embodiment, as shown in FIG. 3, two gate lines gate 2n and gate 2n+1 are arranged between two adjacent rows of pixel sub-areas 11, and two adjacent columns of pixel sub-areas 11 may share one data line data located between the two columns of pixel sub-areas 11, the two adjacent columns of pixel sub-areas 11 can be taken as one pixel group. The sub-transistors T in the first transistor M9 in the (2n−1)-th stage (odd stage) of shift register G 2n−1 are arranged in the n-th row of pixel sub-areas 11 respectively, n is an integer from 1 to N/2, N is the number of the gate lines in the array substrate, i.e., n=1, 2, 3, . . . , N/2. The sub-transistors in the first transistor M9 in the 2n-th stage (even stage) of shift register G2n are arranged between the (2n−1)-th gate line gate 2n−1 and the 2n-th gate line gate 2n. The wires vss are located between two adjacent columns of pixel groups respectively. The number n is an integer greater than or equal to 0 and less than or equal to N/2, N is the number of the gate lines of the array substrate.

In order to simplify the manufacturing process, in the array substrate provided by an embodiment of this disclosure, as shown in FIG. 3, the plurality of sub-transistors T in each first transistor M9 have the same distribution rule in the row direction, i.e., the plurality of sub-transistors comprised in each stage of shift register have the same distribution pattern.

Further, in the array substrate provided by an embodiment of this disclosure, as shown in FIG. 3, the wire vss connected with a sub-transistor T is located at a side of the pixel sub-area 11 where the sub-transistor T locates. In other words, the wire in corresponding connection with each sub-transistor is located outside the pixel sub-area where the sub-transistor locates.

Further, in the array substrate provided by an embodiment of this disclosure, the sub-transistors in an odd stage of shift registers are located in the pixel area and are relatively far from the gate line, whereas the sub-transistors in an even stage of shift register are located between adjacent gate lines and are close to the gate lines. As shown in FIG. 3, the sub-transistors T in the first transistor M9 of the (2n−1)-th stage of shift register G2n−1 are connected with the (2n−1)-th gate line gate 2n−1 through a first wiring, and the sub-transistors T in the first transistor M1 in the 2n-th stage of shift register G2n are connected with the 2n-th gate line gate 2n through a second wiring and a third wiring 13. The first wiring and the second wiring may be metal wirings 12 formed by the same material, and the third wiring can be a metal oxide wiring 13, for example, a wiring formed from is indium tin oxide (ITO). In this way, it is favorable to decreasing the difference in resistances of the connecting lines between the sub-transistors and corresponding gate lines for the odd stage of shift register and the even stage of shift register. In addition, the ITO wiring can also be manufactured simultaneously with other structures such as pixel electrodes or common electrodes, which is helpful for simplifying the manufacturing process of the array substrate.

In an array substrate provided by another embodiment of this disclosure, as shown in FIG. 4, only one gate line gate n is arranged between two adjacent rows of pixel sub-areas 11, and only one data line data is arranged between two adjacent columns of pixel sub-areas 11. The sub-transistors T in the first transistor M9 in the n-th stage of shift register Gn are arranged in the n-th row of pixel sub-area 11 respectively. Each of the wires vss is located between two adjacent columns of pixel sub-areas 11. The number n is an integer from 1 to N, N is the number of the gate lines of the array substrate, i.e., n=1, 2, 3, . . . , N.

In order to simplify the manufacturing process, in the array substrate provided by an embodiment of this disclosure, as shown in FIG. 4, the plurality of sub-transistors T in the first transistors M9 have the same distribution rule in the row direction, i.e., the plurality of sub-transistors comprised in each stage of shift register have the same distribution pattern in the row direction. The "distribution pattern" mentioned herein refers to the overall arrangement of the plurality of sub-transistors in each stage of shift register. For example, in the example of FIG. 4, for the sub-transistors in different stages of shift registers, they are distributed in the same column of pixel sub-unit (e.g., the first column of pixel sub-unit, the third column of pixel sub-unit . . . ) respectively, and the sub-transistors in the same column of pixel sub-unit are substantially aligned in the same vertical line.

Further, in the array substrate provided by an embodiment of this disclosure, as shown in FIG. 4, the wire vss connected with each sub-transistor T is located at a side of the pixel sub-area 11 where the sub-transistor T locates. In other words, the wire in corresponding connection with each sub-transistor is located outside the pixel sub-area where the sub-transistor locates.

Further, in the array substrate provided by an embodiment of this disclosure, as shown in FIG. 3 and FIG. 4, if other devices except for the first transistor in each stage of shift register Gn need to be connected with the first signal line VSS, it can be connected with the wire vss that is closest to the frame area 20.

In the array substrate provided by some embodiments of this disclosure, as shown in FIG. 4, each sub-transistor T is connected with a corresponding gate line through a metal wiring 12.

In specific implementation, in the above array substrate provided by the embodiment of this disclosure, the extending direction of the metal wiring can be parallel with the data line, and the metal wiring can be arranged in a same layer as the data line and formed of the same material. Alternatively, the extending direction of the metal wiring can be parallel with the gate line, in this case, the metal wiring can be arranged in a same layer as the gate line and formed of the same material.

Further, in the above array substrate provided by the embodiment of this disclosure, the material of the metal oxide wiring can be ITO, however, the present invention is not so limited. Metal oxides other than ITO can be used to form the third wiring.

In specific implementation, in the array substrate provided by the above embodiments of this disclosure, if the sub-transistors are located in the pixel sub-area, the metal wiring for connecting the sub-transistors and the corresponding gate lines can be arranged based on actual conditions, which will not be limited herein. For example, the metal wiring can be arranged in a manner of achieving maximum pixel aperture ratio.

Based on the same inventive concept, an embodiment of this disclosure further provides a display panel, comprising the array substrate provided by any one of the above embodiments of this disclosure. Because the principle of the display panel for solving problems is similar as the preceding array substrate, the implementation of the display panel can make reference to the implementation of the preceding array substrate, which will not be repeated herein.

Further, in specific implementation, the above display panel provided by the embodiment of the disclosure can be either a liquid crystal display panel or an organic electroluminescent display panel, which will not be limited here.

As for the array substrate and the display panel provided by embodiments of this disclosure, the array substrate comprises shift registers corresponding to respective gate lines. The transistor in each stage of shift register connected with a corresponding stage of gate line and a next stage of gate line is a first transistor. The signal line connected with the first transistor in a plurality of signal lines connected with the shift register is a first signal line. The first transistor and the signal line connected with the first transistor are arranged in the display area, which can reduce the width of the frame area and would not make the layout of wiring for the array substrate complex.

Apparently, the skilled person in the art can make various amendments and modifications to the disclosure without departing from the spirit and the scope of the invention. Accordingly, provided that these amendments and modifications of this disclosure belong to the scopes of the claims of the disclosure and equivalent technologies thereof, the present invention also intends to encompass these amendments and modifications.

The invention claimed is:

1. An array substrate, comprising:
a base substrate that comprises a display area and a frame area surrounding the display area, the display area comprising data lines and gate lines in staggered arrangement;
shift registers in one-to-one correspondence with the gate lines, each stage of shift register comprising a plurality of transistors, wherein one of the plurality of transistors in the shift register that is connected with both a gate line corresponding to the shift register and a gate line of a next stage is a first transistor, wherein the first transistor in each shift register is located in the display area, and other transistors of the plurality of transistors are located in the frame area;
a plurality of signal lines connected with the shift registers, wherein a signal line of the plurality of signal lines connected with the first transistor is a first signal line, wherein the first signal line is located in the display area, and other signal lines of the plurality of signal lines are located in the frame area.

2. The array substrate according to claim 1, wherein the display area comprises a plurality of pixel sub-areas arranged in a matrix, each first transistor includes at least two sub-transistors of a same size and connected in parallel with each other, wherein a number of the sub-transistors in each first transistor is less than or equal to a number of the pixel sub-areas in a row of pixels corresponding to the shift register where the first transistor locates, and wherein the sub-transistors are evenly distributed in the display area.

3. The array substrate according to claim 2, wherein each of the first transistors has a same number of sub-transistors.

4. The array substrate according to claim 3, wherein the first signal line comprises a plurality of wires, the sub-transistors included in each first transistor are connected with the plurality of wires in one-to-one correspondence.

5. The array substrate according to claim 4, wherein the first transistor is configured to enable a signal on a gate line corresponding to the shift register where the first transistor locates to be same as a signal on the first signal line in response to receipt of an effective signal on a gate line corresponding to a shift register of a next stage.

6. The array substrate according to claim 4, wherein two gate lines are arranged between every two adjacent rows of pixel sub-areas, and every two adjacent columns of pixel sub-areas share one data line located between the two adjacent columns of pixel sub-areas, the two adjacent columns of pixel sub-areas defines a pixel group.

7. The array substrate according to claim 6, wherein sub-transistors of the first transistor in a (2n−1)-th stage of shift register are arranged in an n-th row of pixel sub-area, n is an integer from 1 to N/2, N is the number of the gate lines in the array substrate,
wherein sub-transistors of the first transistor in a 2n-th stage of shift register are arranged between a (2n−1)-th gate line and a 2n-th gate line.

8. The array substrate according to claim 7, wherein the sub-transistors of the first transistor in the (2n−1)-th stage of shift register are connected with the (2n−1)-th gate line through a first wiring;
the sub-transistors of the first transistor in the 2n-th stage of shift register are connected with the 2n-th gate line through a second wiring and a third wiring.

9. The array substrate according to claim 8, wherein the first wiring and the second wiring are metal wirings formed from a same material, the third wiring is a metal oxide wiring.

10. The array substrate according to claim 7, wherein the plurality of sub-transistors comprised in each stage of shift register have a same distribution pattern in a row direction.

11. The array substrate according to claim 10, wherein the wire in corresponding connection with each sub-transistor is located outside the pixel sub-area where the sub-transistor locates.

12. The array substrate according to claim 6, wherein each of the wires is located between two adjacent pixel groups respectively.

13. The array substrate according to claim 4, wherein only one gate line is arranged between two adjacent rows of pixel sub-areas, and only one data line is arranged between two adjacent columns of pixel sub-areas;
wherein the sub-transistors of the first transistor in an n-th stage of shift register are arranged in an n-th row of pixel sub-area, n is an integer from 1 to N, N is the number of the gate lines in the array substrate.

14. The array substrate according to claim 1, wherein the plurality of signal lines comprise a clock signal line for transmitting a clock signal, a first reference potential signal line for providing a high reference potential and a second reference potential signal line for providing a low reference potential.

15. The array substrate according to claim 14, wherein the first signal line is the second reference potential signal line for providing the low reference potential.

16. A display panel, characterized by comprising the array substrate according to claim 1.

17. The display panel according to claim 16, wherein the display area comprises a plurality of pixel sub-areas arranged in a matrix, each first transistor includes at least two sub-transistors of a same size and connected in parallel with each other, wherein a number of the sub-transistors in each first transistor is less than or equal to a number of the pixel sub-areas in a row of pixels corresponding to the shift register where the first transistor locates, and wherein the sub-transistors are evenly distributed in the display area.

18. The display panel according to claim 17, wherein each of the first transistors has a same number of sub-transistors.

19. The display panel according to claim 18, wherein the first signal line comprises a plurality of wires, the sub-transistors included in each first transistor are connected with the plurality of wires in one-to-one correspondence.

20. The display panel according to claim 19, wherein the first transistor is configured to enable a signal on a gate line corresponding to the shift register where the first transistor locates to be same as a signal on the first signal line in response to receipt of an effective signal on a gate line corresponding to a shift register of a next stage.

* * * * *